(12) United States Patent
Punzalan et al.

(10) Patent No.: US 7,777,310 B2
(45) Date of Patent: Aug. 17, 2010

(54) INTEGRATED CIRCUIT PACKAGE SYSTEM WITH INTEGRAL INNER LEAD AND PADDLE

(75) Inventors: Jeffrey D. Punzalan, Singapore (SG); Henry Descalzo Bathan, Singapore (SG); Zigmund Ramirez Camacho, Singapore (SG); Arnel Trasporto, Singapore (SG)

(73) Assignee: Stats Chippac Ltd., Singapore (SG)

( * ) Notice: Subject to any disclaimer, the term of this patent is extended or adjusted under 35 U.S.C. 154(b) by 223 days.

(21) Appl. No.: 11/670,862

(22) Filed: Feb. 2, 2007

(65) Prior Publication Data
US 2008/0185693 A1 Aug. 7, 2008

(51) Int. Cl.
*H01L 23/495* (2006.01)
(52) U.S. Cl. .............. 257/676; 438/123; 257/E23.043; 257/E23.046; 257/E23.047
(58) Field of Classification Search .............. 257/666, 257/676, 784, 786, E23.015, E23.043, E23.046, 257/E23.047; 438/123, 689
See application file for complete search history.

(56) References Cited

U.S. PATENT DOCUMENTS

| | | | |
|---|---|---|---|
| 6,498,099 B1 * | 12/2002 | McLellan et al. | 438/689 |
| 6,809,405 B2 * | 10/2004 | Ito et al. | 257/666 |
| 6,995,459 B2 | 2/2006 | Lee et al. | |
| 7,001,799 B1 | 2/2006 | Edwards et al. | |
| 7,060,536 B2 | 6/2006 | Punzalan et al. | |
| 7,109,572 B2 | 9/2006 | Fee et al. | |
| 2004/0070056 A1 * | 4/2004 | Matsuzawa et al. | 257/666 |
| 2005/0051877 A1 * | 3/2005 | Hsu | 257/667 |

* cited by examiner

*Primary Examiner*—Matthew C Landau
*Assistant Examiner*—Jessica Hall
(74) *Attorney, Agent, or Firm*—Mikio Ishimaru

(57) ABSTRACT

An integrated circuit package system is provided including forming a paddle, an outer lead, and an inner lead between the paddle and the outer lead; forming a non-vertical paddle edge of the paddle and a non-vertical lead edge of the inner lead facing the non-vertical paddle edge; and encapsulating an integrated circuit die over the paddle.

15 Claims, 6 Drawing Sheets

INTEGRATED CIRCUIT PACKAGE SYSTEM WITH INTEGRAL INNER LEAD AND PADDLE

TECHNICAL FIELD

The present invention relates generally to integrated circuit package system, and more particularly to an integrated circuit package system having multiple rows of leads.

BACKGROUND ART

Increased miniaturization of components, greater packaging density of integrated circuits ("ICs"), higher performance, and lower cost are ongoing goals of the computer industry. As new generations of IC products are released, the number of devices used to fabricate them tends to decrease due to advances in technology. Simultaneously, the functionality of these products increases.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook personal computers, and so forth. All of these devices continue to be made smaller and thinner to improve their portability. Accordingly, large scale IC ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a lead frame whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a lead frame), a wire-bonding process (electrically connecting the semiconductor die on the paddle to inner leads using lead frame wires), a molding process (encapsulating a predetermined portion of the assembly, containing the die, inner leads and lead frame wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the quad flat no-lead package ("QFN"). QFN packages typically comprise a lead frame, such as a conductive sheet stamped and etched, with a semiconductor die having a multitude of bond pads mounted to the top side of the lead frame. Wire bonds electrically connect the bond pads, of the semiconductor die, to a series of conductive lead fingers on the top side of the lead frame. Typically, the semiconductor die and the wire bonds are encapsulated within a molding compound.

In order to reduce manufacturing costs, the electronics industry is increasing the usage of QFN packages. In the manufacturing process, many obstacles must be overcome to deliver extremely small packages with increased number of input/output (I/O) in high volume.

One such obstacle is mold flash covering some of the inner lead contacts and preventing a reliable printed circuit board connection. This situation may be caused by debris on the mold bottom chase under the lead fingers or the clamping pressure on one end of a half etched lead causes the other end to lift. Another possibility is that the lead fingers may be bent or lifted prior to the molding step. The result of these issues is that the finished package may be missing some of the contact pads necessary to connect it to the printed circuit board.

Still thinner, smaller, higher I/O, and lighter package designs and mounting/connecting configurations have been adopted in response to continuing requirements for further miniaturization. At the same time, users are demanding semiconductor packages that are more reliable under increasingly severe operating conditions.

Thus, a need still remains for an integrated circuit package system providing low cost manufacturing, improved yield, higher pin count, and thinner height for the integrated circuits. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a paddle, an outer lead, and an inner lead between the paddle and the outer lead; forming a non-vertical paddle edge of the paddle and a non-vertical lead edge of the inner lead facing the non-vertical paddle edge; and encapsulating an integrated circuit die over the paddle.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
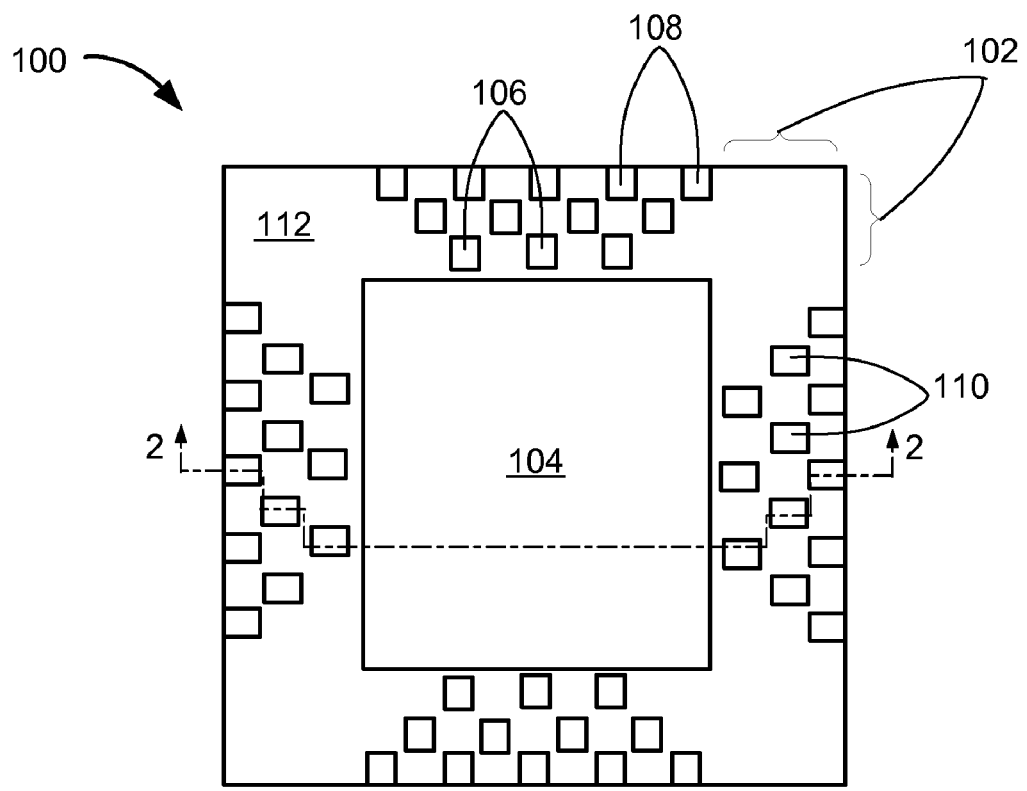
FIG. 1 is a bottom view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. In addition, where multiple embodiments are disclosed and described having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a bottom view of an integrated circuit package system 100 in an embodiment of the present invention. The bottom view depicts multiple rows of leads 102 around a paddle 104, such as a die-attach paddle. The leads 102 include rows inner leads 106, rows of outer leads 108, and rows of middle leads 110 between the rows of the inner leads 106 and the outer leads 108.

An encapsulation 112, such as an epoxy mold compound, surrounds the paddle 104, the inner leads 106, and the middle leads 110. The encapsulation 112 also partially surrounds the outer leads 108. The encapsulation 112 exposes the leads 102 and the paddle 104 for further connections.

For illustrative purposes, the encapsulation 112 is shown exposing the paddle 104, although it is understood that the paddle 104 may not be exposed. Also for illustrative purposes, the inner leads 106 are shown offset or staggered from the middle leads 110, although it is understood that the inner leads 106 and the middle leads 110 may not be staggered. Further for illustrative purposes, the outer leads 108 are shown offset or staggered from the middle leads 110, although it is understood that the outer leads 108 and the middle leads 110 may not be staggered.

Figure 2:
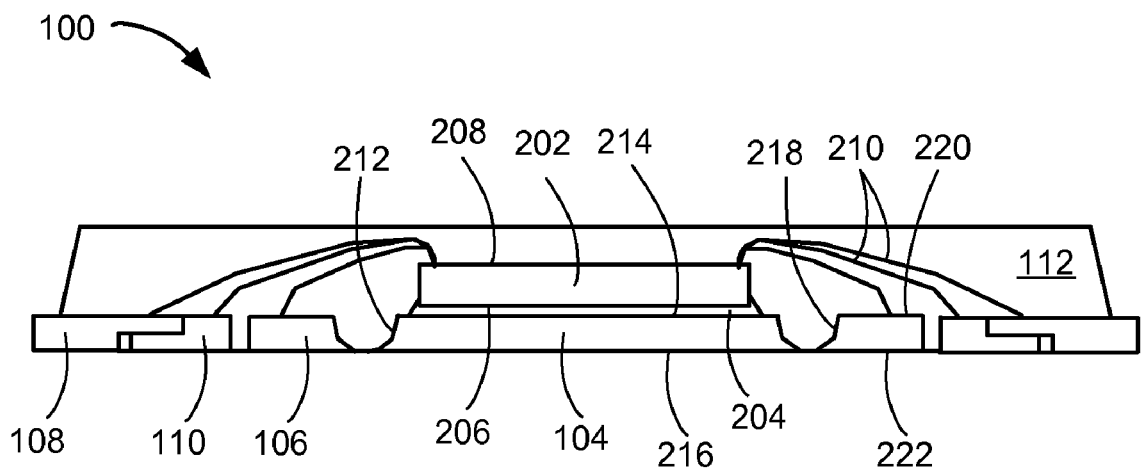
FIG. 2 is a cross-sectional view of the integrated circuit package system along a line 2-2 of FIG. 1.

Referring now to FIG. 2, therein is shown is a cross-sectional view of the integrated circuit package system 100 along a line 2-2 of FIG. 1. The cross-sectional view depicts an integrated circuit die 202 mounted over the paddle 104 with an adhesive 204, such as a die-attach adhesive. The integrated circuit die 202 has a non-active side 206 and an active side 208 having circuitry fabricated thereon. Interconnects 210, such as bond wires, connect the active side 208 with the inner leads 106, the middle leads 110, and the outer leads 108. The encapsulation 112 covers the integrated circuit die 202 and the interconnects 210. The encapsulation 112 partially covers the inner leads 106, the middle leads 110, and the outer leads 108.

The paddle 104 has non-vertical paddle edges 212, such as curved or sloped edges, with a first side 214 of the paddle 104 facing the integrated circuit die 202 and a second side 216 of the paddle 104 are not the same dimension. The second side 216 is opposite the first side 214 and is exposed by the encapsulation 112.

The paddle 104 may serve multiple functions. The paddle 104 may function as a heat sink or heat spreader for the integrated circuit die 202 providing a thermal dissipation path to ambient. The paddle 104 may be connected to an electrical ground and may function as an electromagnetic interference (EMI) shield.

Each of the inner leads 106 has a non-vertical lead edge 218, such as a curved or a sloped edge, and the non-vertical lead edge faces the paddle 104 and the non-vertical paddle edges 212. The edge of the inner leads 106 opposite the non-vertical lead edge 218 is a substantially vertical edge extending from a non-exposed side 220 of the inner leads 106 to an exposed side 222. The non-exposed side 220 of the inner leads 106 and the exposed side 222 of the inner leads 106 are not the same dimension. The non-vertical lead edge 218 is further away from the paddle near the non-exposed side 220 at the top of the inner leads 106, and is closer to the paddle near the exposed side 222 at the bottom of the inner leads 106.

For illustrative purposes, the active side 208 is shown facing away from the paddle 104, although it is understood that the integrated circuit die 202 may have the active side 208 facing the paddle 104, such as a flip chip. Also for illustrative purposes, the integrated circuit die 202 is shown smaller than the paddle 104, although it is understood that the integrated circuit die 202 may overhang the paddle 104.

Figure 3:
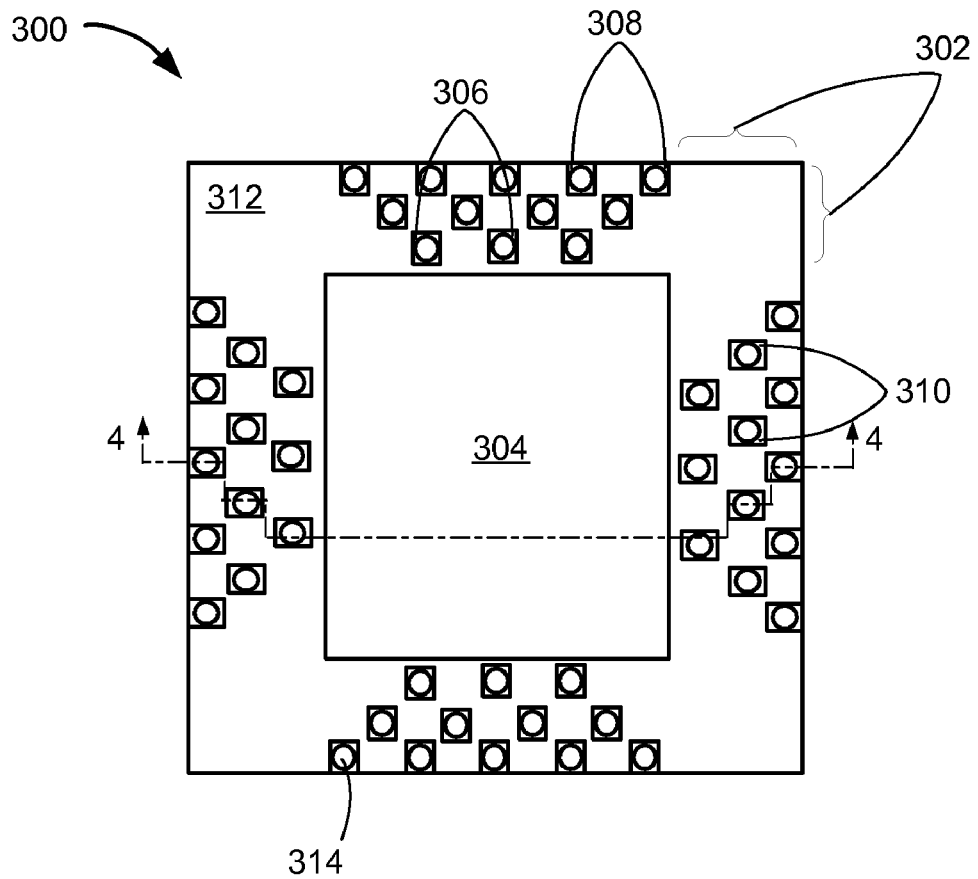
FIG. 3 is a bottom view of an integrated circuit package system in an alternative embodiment of the present invention.

Referring now to FIG. 3, therein is shown is a bottom view of an integrated circuit package system 300 in an alternative embodiment of the present invention. The bottom view depicts multiple rows of leads 302 around a paddle 304, such as a die-attach paddle. The leads 302 include rows inner leads 306, rows of outer leads 308, and rows of middle leads 310 between the rows of the inner leads 306 and the outer leads 308.

An encapsulation 312, such as an epoxy mold compound, surrounds the paddle 304, the inner leads 306, and the middle leads 310. The encapsulation 312 also partially surrounds the outer leads 308. The encapsulation 312 exposes the leads 302 and the paddle 304. External interconnects 314, such as solder balls, connect to the inner leads 306, the outer leads 308, and the middle leads 310.

For illustrative purposes, the encapsulation 312 is shown exposing the paddle 304, although it is understood that the paddle 304 may not be exposed. Also for illustrative purposes, the inner leads 306 are shown offset or staggered from the middle leads 310, although it is understood that the inner leads 306 and the middle leads 310 may not be staggered. Further for illustrative purposes, the outer leads 308 are shown offset or staggered from the middle leads 310, although it is understood that the outer leads 308 and the middle leads 310 may not be staggered.

Figure 4:
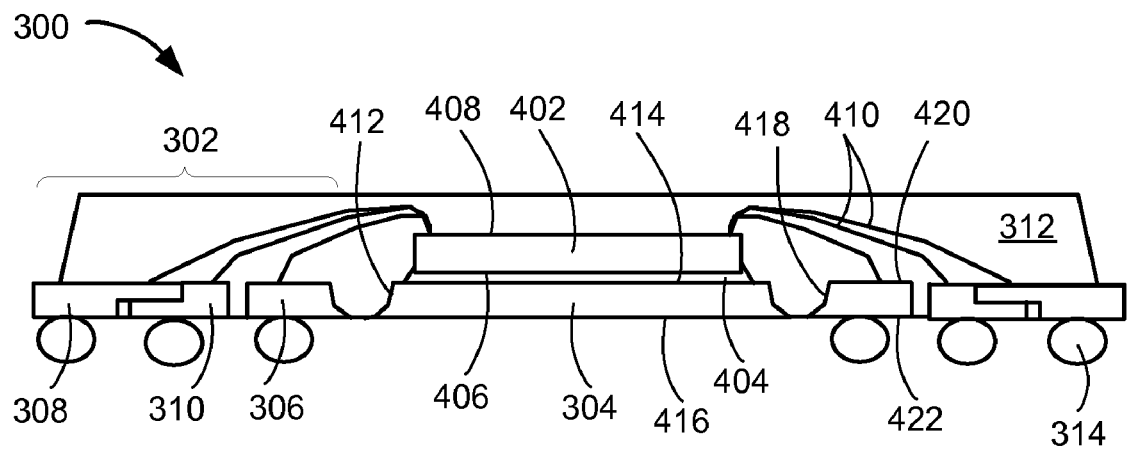
FIG. 4 is a cross-sectional view of the integrated circuit package system along a line 4-4 of FIG. 3.

Referring now to FIG. 4, therein is shown a cross-sectional view of the integrated circuit package system 300 along a line 4-4 of FIG. 3. The cross-sectional view depicts an integrated circuit die 402 mounted over the paddle 304 with an adhesive 404, such as a die-attach adhesive. The integrated circuit die 402 has a non-active side 406 and an active side 408 having circuitry fabricated thereon. Interconnects 410, such as bond wires, connect the active side 408 with the inner leads 306, the middle leads 310, and the outer leads 308. The encapsulation 312 covers the integrated circuit die 402 and the interconnects 410. The encapsulation 312 partially covers the inner leads 306, the middle leads 310, and the outer leads 308.

The paddle 304 has non-vertical paddle edges 412, such as a curved or sloped edges, with a first side 414 of the paddle 304 facing the integrated circuit die 402 and a second side 416 of the paddle 304 are not the same dimension. The second side 416 is opposite the first side 414 and is exposed by the encapsulation 312.

The paddle 304 may serve multiple functions. The paddle 304 may function as a heat sink or heat spreader for the integrated circuit die 402 providing a thermal dissipation path to ambient. The paddle 304 may be connected to an electrical ground and may function as an electromagnetic interference (EMI) shield.

Each of the inner leads 306 has a non-vertical lead edge 418, such as a curved or a sloped edge, facing the paddle 304 and the non-vertical paddle edges 412. A non-exposed side 420 of the inner leads 306 and an exposed side 422 of the inner leads 306 are not the same dimension. The external interconnects 314 attach to the exposed side 422 of the inner leads 306. The external interconnects 314 attach to the outer leads 308 and the middle leads 310 at the same as the exposed side 422 of the inner leads 306.

For illustrative purposes, the active side 408 is shown facing away from the paddle 304, although it is understood that the integrated circuit die 402 may have the active side 408 facing the paddle 304, such as a flip chip. Also for illustrative purposes, the integrated circuit die 402 is shown smaller than the paddle 304, although it is understood that the integrated circuit die 402 may overhang the paddle 304. Further for illustrative purposes, the external interconnects 314 are shown attached to the leads 302, although it is understood that the external interconnects 314 may not attach to the leads 302, such as pre-plated finish the leads 302 or solder dip the leads 302.

Figure 5:
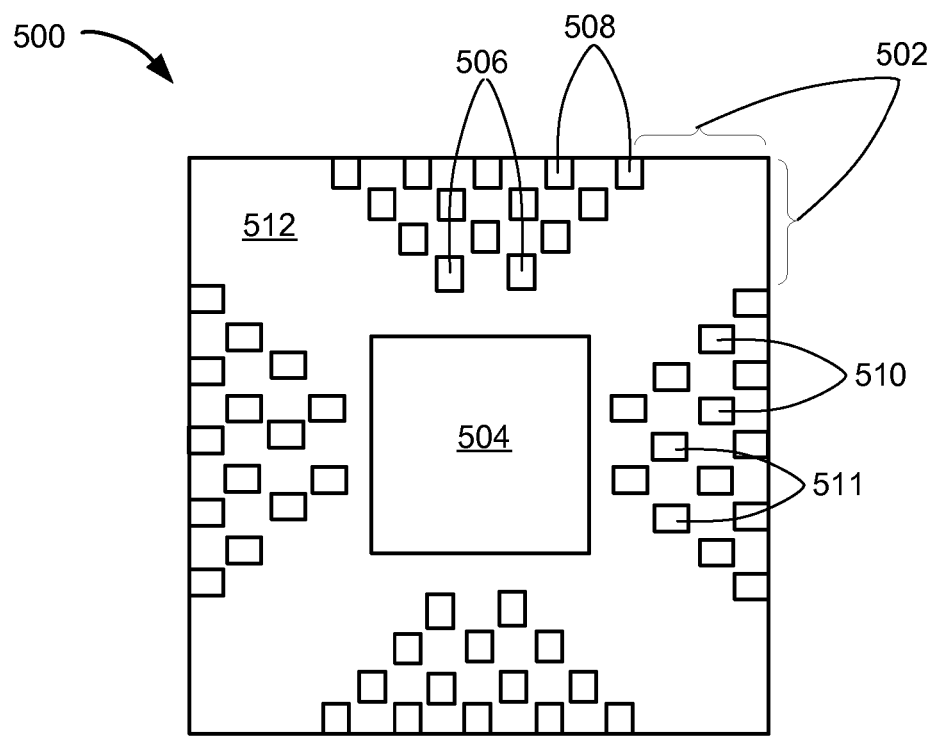
FIG. 5 is a bottom view of an integrated circuit package system in another alternative embodiment of the present invention.

Referring now to FIG. 5, therein is shown a bottom view of an integrated circuit package system 500 in another alternative embodiment of the present invention. The bottom view depicts multiple rows of leads 502 around a paddle 504, such as a die-attach paddle. The leads 502 include rows inner leads 506, rows of outer leads 508, rows of first middle leads 510, and rows of second middle leads 511.

The first middle leads 510 and the second middle leads 511 are between the rows of the inner leads 506 and the outer leads 508. The rows of the first middle leads 510 are between the rows of the second middle leads 511 and the rows of the inner leads 506. The rows of the second middle leads 511 are between the rows of the outer leads 508 and the rows of the first middle leads 510.

An encapsulation 512, such as an epoxy mold compound, surrounds the paddle 504, the inner leads 506, the first middle leads 510, and the second middle leads 511. The encapsulation 512 also partially surrounds the outer leads 508. The encapsulation 512 exposes the leads 502 and the paddle 504 for further connections.

For illustrative purposes, the encapsulation 512 is shown exposing the paddle 504, although it is understood that the paddle 504 may not be exposed. Also for illustrative purposes, the inner leads 506 are shown offset or staggered from the first middle leads 510, although it is understood that the inner leads 506 and the first middle leads 510 may not be staggered. Further for illustrative purposes, the outer leads 508 are shown offset or staggered from the second middle leads 511, although it is understood that the outer leads 508 and the second middle leads 511 may not be staggered. Yet further for illustrative purposes, the first middle leads 510 are shown as offset or staggered from the second middle leads 511, although it is understood that the first middle leads 510 and the second middle leads 511 may not be staggered.

Figure 6:
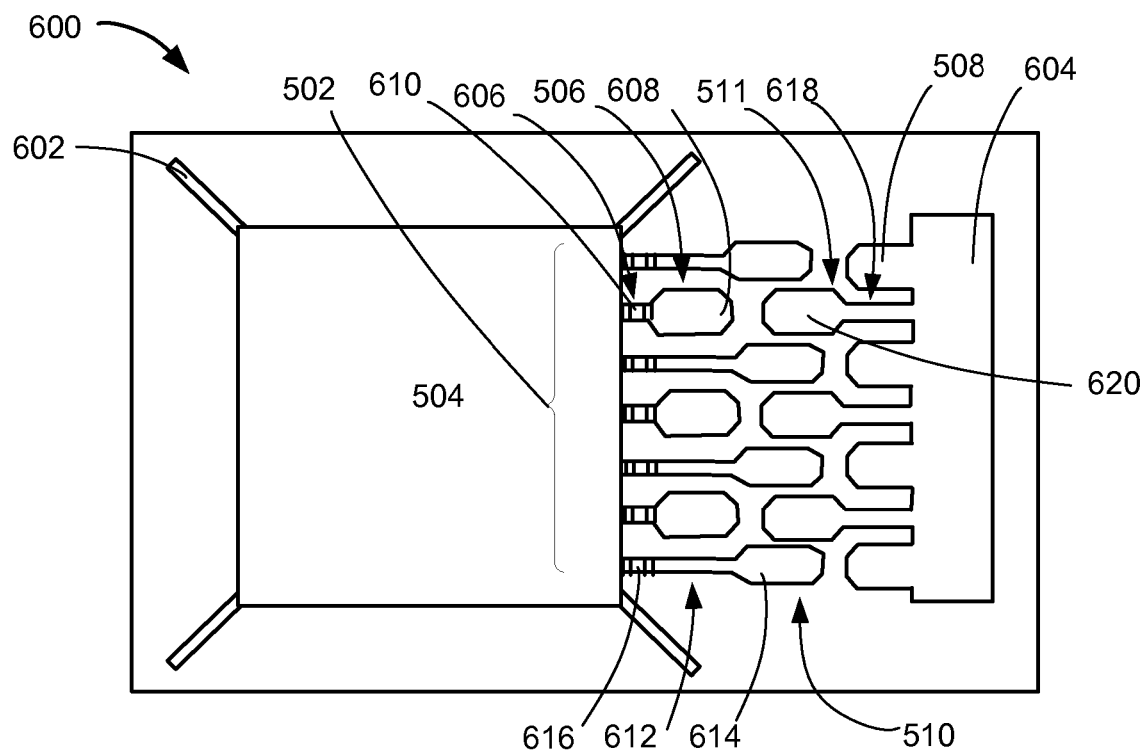
FIG. 6 is a top view of a portion a lead frame of the integrated circuit package system of FIG. 5.

Referring now to FIG. 6, therein is shown a top view of a portion a lead frame 600 of the integrated circuit package system 500 of FIG. 5. The lead frame 600 includes tie bars 602 connected to the paddle 504 and a dam bar 604. The lead frame 600 also includes the inner leads 506 the outer leads 508, the first middle leads 510, and the second middle leads 511. The top view depicts the inner leads 506 and the first middle leads 510 integral to the paddle 504. The outer leads 508 and the second middle leads 511 are integral to the dam bar 604 of the lead frame 600.

Each of the inner leads 506 has an inner lead tip 606 and an inner lead body 608, wherein the inner lead body 608 is wider than the inner lead tip 606. The inner leads 506 extend from the paddle 504 with the inner lead tip 606 extending from the paddle 504. The inner lead tip 606 includes an inner lead protrusion 610. The inner lead body 608 is exposed from the encapsulation 512 of FIG. 5 for further connections.

Each of the first middle leads 510 has a first lead tip 612 and a first lead body 614, wherein the first lead body 614 is wider than the first lead tip 612. The first middle leads 510 extend from the paddle 504 with the first lead tip 612 extending from the paddle 504. The first lead tip 612 includes a first lead protrusion 616. The first lead body 614 is exposed from the encapsulation 512 for further connections.

Each of the second middle leads 511 has a second lead tip 618 and a second lead body 620, wherein the second lead body 620 is wider than the second lead tip 618. The second middle leads 511 extend from the dam bar 604 towards the paddle 504 with the second lead tip 618 extending from the dam bar 604. The second lead body 620 is exposed from the encapsulation 512 for further connections. The outer leads 508 extend from the dam bar 604 towards the paddle 504.

For illustrative purposes, the lead frame 600 is shown having four rows of the leads 502, although it is understood that the lead frame 600 may have a different number of rows of the leads 502. Also for illustrative purposes, the inner lead tip 606, the first lead tip 612, and the second lead tip 618 are shown as substantially linear, although it is understood that the inner lead tip 606, the first lead tip 612, and the second lead tip 618 for each of the inner leads 506, the first middle leads 510, and the second middle leads 511, respectively, may not be linear, such as curved or have angled segments. Further for illustrative purposes, the inner leads 506 and the first middle leads 510 are shown extending from the paddle 504, although it is understood that the leads 502 extending from the paddle 504 may be different, such as the second middle leads 511 extending from the paddle 504.

Figure 7:
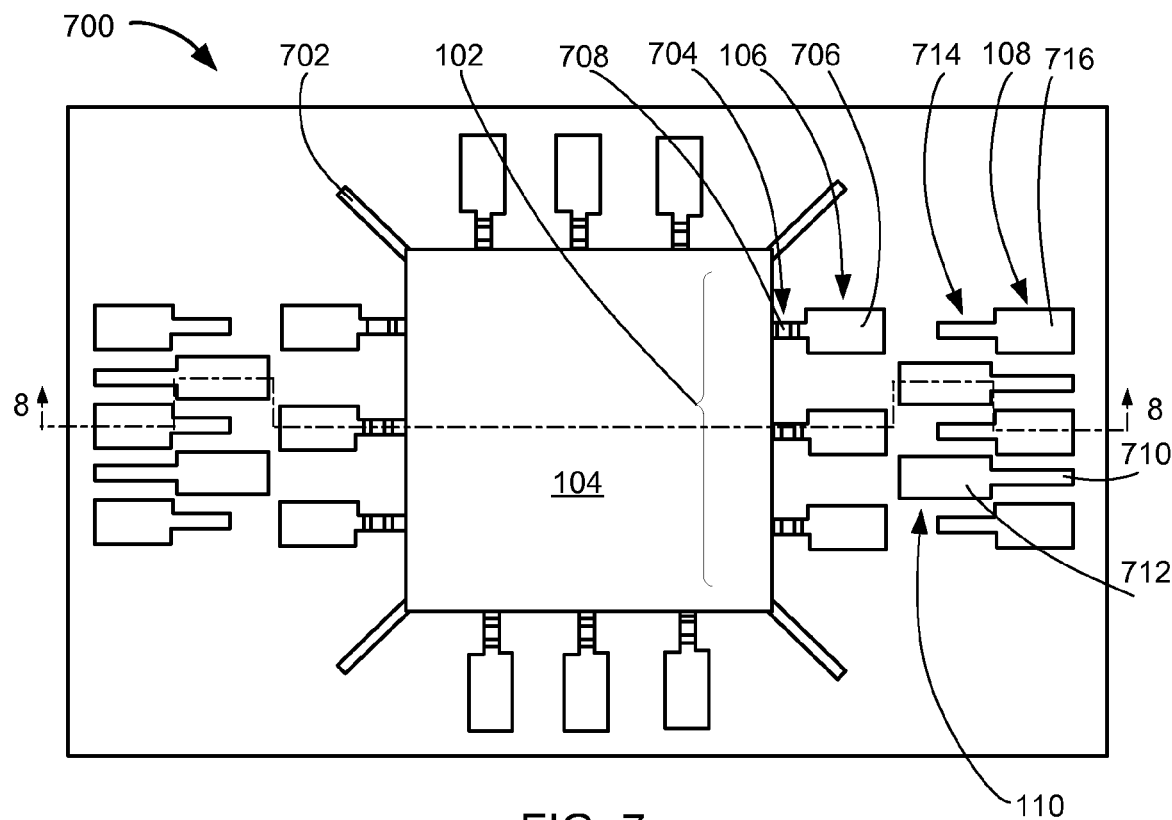
FIG. 7 is a top view of a portion a lead frame of the integrated circuit package system of FIG. 1.

Referring now to FIG. 7, therein is shown a top view of a portion a lead frame 700 of the integrated circuit package system 100 of FIG. 1. The lead frame 700 includes tie bars 702 connected to the paddle 104. The lead frame 700 also includes the inner leads 106 the outer leads 108, and the middle leads 110. The top view depicts the inner leads 106 integral to the paddle 104. The outer leads 108 and the middle leads 110 are integral to the dam bar (not shown) of the lead frame 700.

Each of the inner leads 106 has an inner lead tip 704 and an inner lead body 706, wherein the inner lead body 706 is wider than the inner lead tip 704. The inner leads 106 extend from the paddle 104 with the inner lead tip 704 extending from the paddle 104. The inner lead tip 704 includes an inner lead protrusion 708. The inner lead body 706 is exposed from the encapsulation 112 of FIG. 5 for further connections.

Each of the middle leads 110 has a middle lead tip 710 and a middle lead body 712, wherein the middle lead body 712 is wider than the middle lead tip 710. The middle leads 110 extend from the dam bar towards the paddle 104 with the middle lead tip 710 extending from the dam bar. The middle lead body 712 is exposed from the encapsulation 112 for further connections.

Each of the outer leads 108 has an outer lead tip 714 and an outer lead body 716, wherein the outer lead body 716 is wider than the outer lead tip 714. The outer leads 108 extend from the dam bar towards the paddle 104 with the outer lead body 716 extending from the dam bar. The outer lead body 716 is exposed from the encapsulation 112 for further connections.

For illustrative purposes, the lead frame 700 is shown having three rows of the leads 102, although it is understood that the lead frame 700 may have a different number of rows of the leads 102. Also for illustrative purposes, the inner lead tip 704, the outer lead tip 714, and the middle lead tip 710 are shown as substantially linear, although it is understood that the inner lead tip 704, the outer lead tip 714, and the middle lead tip 710 for each of the inner leads 106, the outer leads 108, and the middle leads 110, respectively, may not be linear, such as curved or have angled segments. Further for illustrative purposes, the inner leads 106 are shown extending from the paddle 104, although it is understood that the leads 102 extending from the paddle 104 may be different, such as the middle leads 110 extending from the paddle 104.

Figure 8:
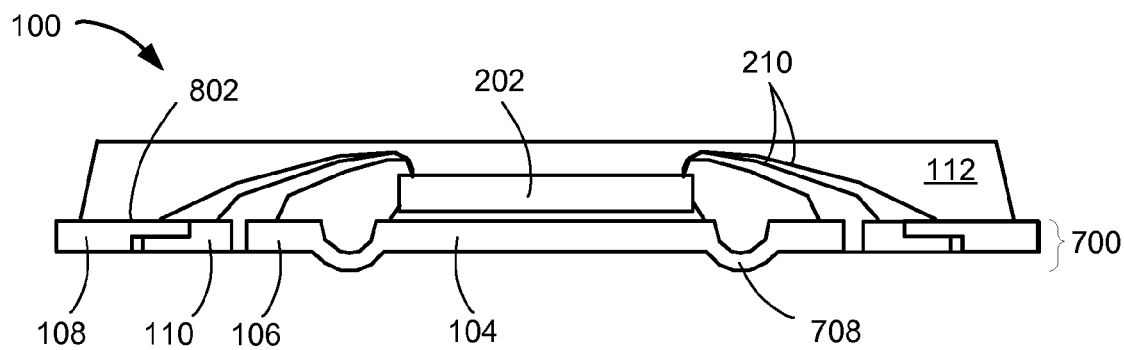
FIG. 8 is a cross-sectional view of the integrated circuit package system having the lead frame along a line 8-8 of FIG. 7 in a molding phase.

Referring now to FIG. 8, therein is shown a cross-sectional view of the integrated circuit package system 100 having the lead frame 700 along a line 8-8 of FIG. 7 in a molding phase. The cross-sectional view depicts the integrated circuit die 202 over the paddle 104. The interconnects 210 connect the integrated circuit die 202 with the inner leads 106, the middle leads 110, and the outer leads 108. The encapsulation 112 covers the integrated circuit die 202 and the interconnects 210. The encapsulation 112 partially covers the inner leads 106, the middle leads 110, and the outer leads 108 with the inner lead protrusion 708 exposed. The inner lead protrusion 708 maintains a planar surface 802 of the inner leads 106 mitigating or eliminating mold flashes of the inner leads 106.

Figure 9:
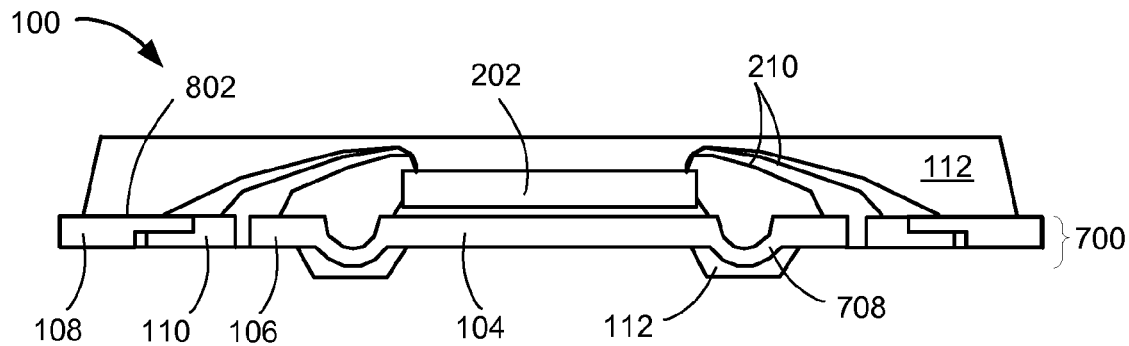
FIG. 9 is a cross-sectional view of the integrated circuit package having the lead frame along a line 8-8 of FIG. 7 in an alternative molding phase.

Referring now to FIG. 9, therein is shown a cross-sectional view of the integrated circuit package system 100 having the lead frame 700 along a line 8-8 of FIG. 7 in an alternative molding phase. The interconnects 210 connect the integrated circuit die 202 with the inner leads 106, the middle leads 110, and the outer leads 108. The encapsulation 112 covers the integrated circuit die 202 and the interconnects 210. The encapsulation 112 partially covers the inner leads 106, the middle leads 110, and the outer leads 108. The encapsulation 112 also covers the inner lead protrusion 708. The encapsulation 112 may be formed a number of different processes, such as utilizing bottom molding chase having cavities or trenches for covering the inner lead protrusion 708. The inner lead protrusion 708 maintains the planar surface 802 of the inner leads 106 mitigating or eliminating mold flashes of the inner leads 106.

Figure 10:
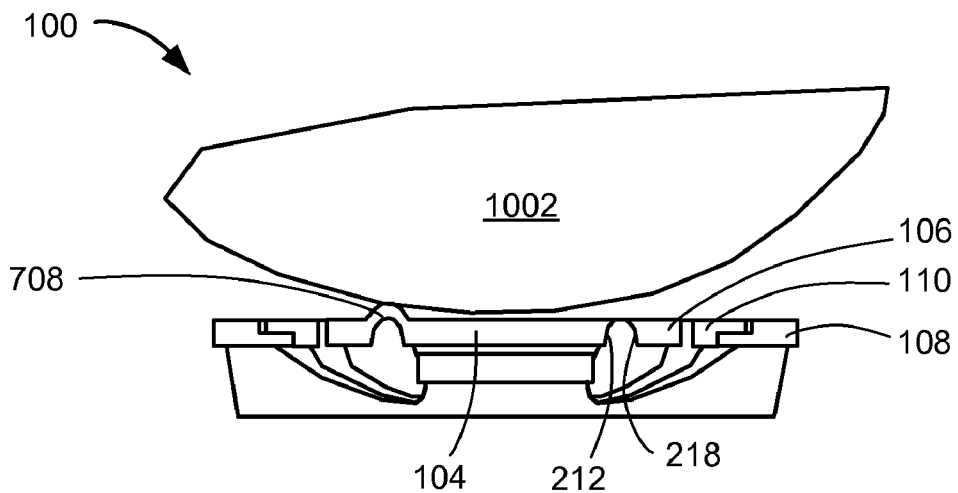
FIG. 10 is the structure of FIG. 9 in a phase for removing the inner lead protrusion.

Referring now to FIG. 10, therein is shown the structure of FIG. 9 in a phase for removing the inner lead protrusion 708. The structure of FIG. 9 may undergo a grinding process with a grinding wheel 1002 for removing the inner lead protrusion 708 from each of the inner leads 106 and electrically isolating the inner leads 106 from the paddle 104. The removal of the inner lead protrusion 708 forms the non-vertical paddle edges 212 and the non-vertical lead edge 218, wherein the non-vertical paddle edges 212 and the non-vertical lead edge 218 are characterized in being formed from grinding of the inner lead protrusion 708 in the inner leads 106 integral with the paddle 104 to form the non-vertical lead edge 218 facing the non-vertical paddle edges 212. The grinding process leaves the inner leads 106, the outer leads 108, and the middle leads 110 exposed. The grinding process may occur before or after singulation of the integrated circuit package system 100.

Figure 11:
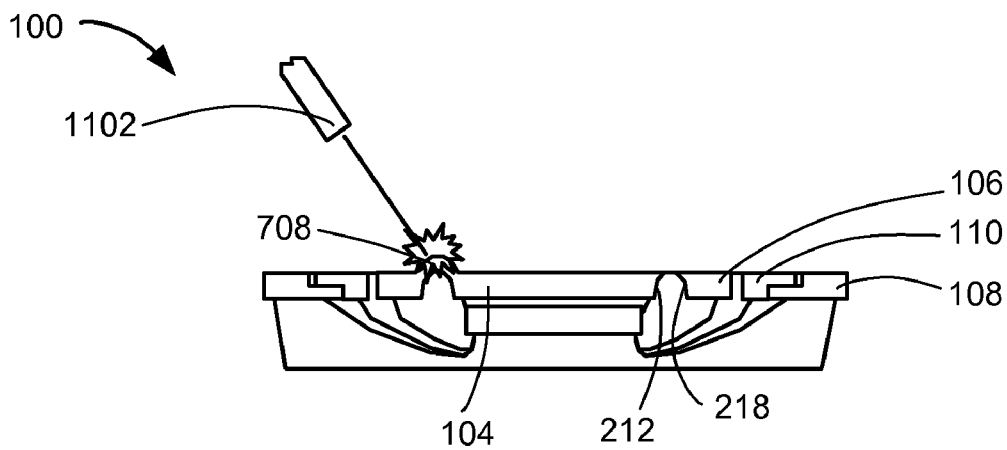
FIG. 11 is the structure of FIG. 9 in an alternative phase for removing the inner lead protrusion.

Referring now to FIG. 11, therein is shown the structure of FIG. 9 in an alternative phase for removing the inner lead protrusion 708. The structure of FIG. 9 may undergo a lasing process with a laser 1102 for removing the inner lead protrusion 708 from each of the inner leads 106 and electrically isolating the inner leads 106 from the paddle 104. The removal of the inner lead protrusion 708 forms the non-vertical paddle edges 212 and the non-vertical lead edge 218, wherein the non-vertical paddle edges 212 and the non-vertical lead edge 218 are characterized in being formed from lasing of the inner lead protrusion 708 in the inner leads 106 integral with the paddle 104 to form the non-vertical lead edge 218 facing the non-vertical paddle edges 212. The lasing process leaves the inner leads 106, the outer leads 108, and the middle leads 110 exposed. The lasing process may occur before or after singulation of the integrated circuit package system 100.

Figure 12:
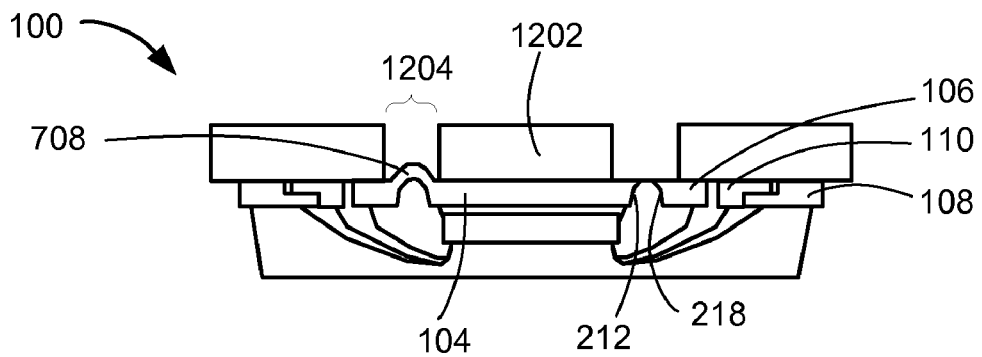
FIG. 12 is the structure of FIG. 9 in another alternative phase for removing the inner lead protrusion.

Referring now to FIG. 12, therein is shown the structure of FIG. 9 in another alternative phase for removing the inner lead protrusion 708. The structure of FIG. 9 may undergo an etching process with a mask 1202 and chemical etch. The mask 1202 has holes 1204 exposing the inner lead protrusion 708 for etching. The etching process electrically isolates the inner leads 106 from the paddle 104. The removal of the inner lead protrusion 708 forms the non-vertical paddle edges 212 and the non-vertical lead edge 218, wherein the non-vertical paddle edges 212 and the non-vertical lead edge 218 are characterized in being formed from etching of the inner lead protrusion 708 in the inner leads 106 integral with the paddle 104 to form the non-vertical lead edge 218 facing the non-vertical paddle edges 212. The etching process leaves the inner leads 106, the outer leads 108, and the middle leads 110 exposed with the mask 1202 removed. The etching process may occur before or after singulation of the integrated circuit package system 100.

Figure 13:
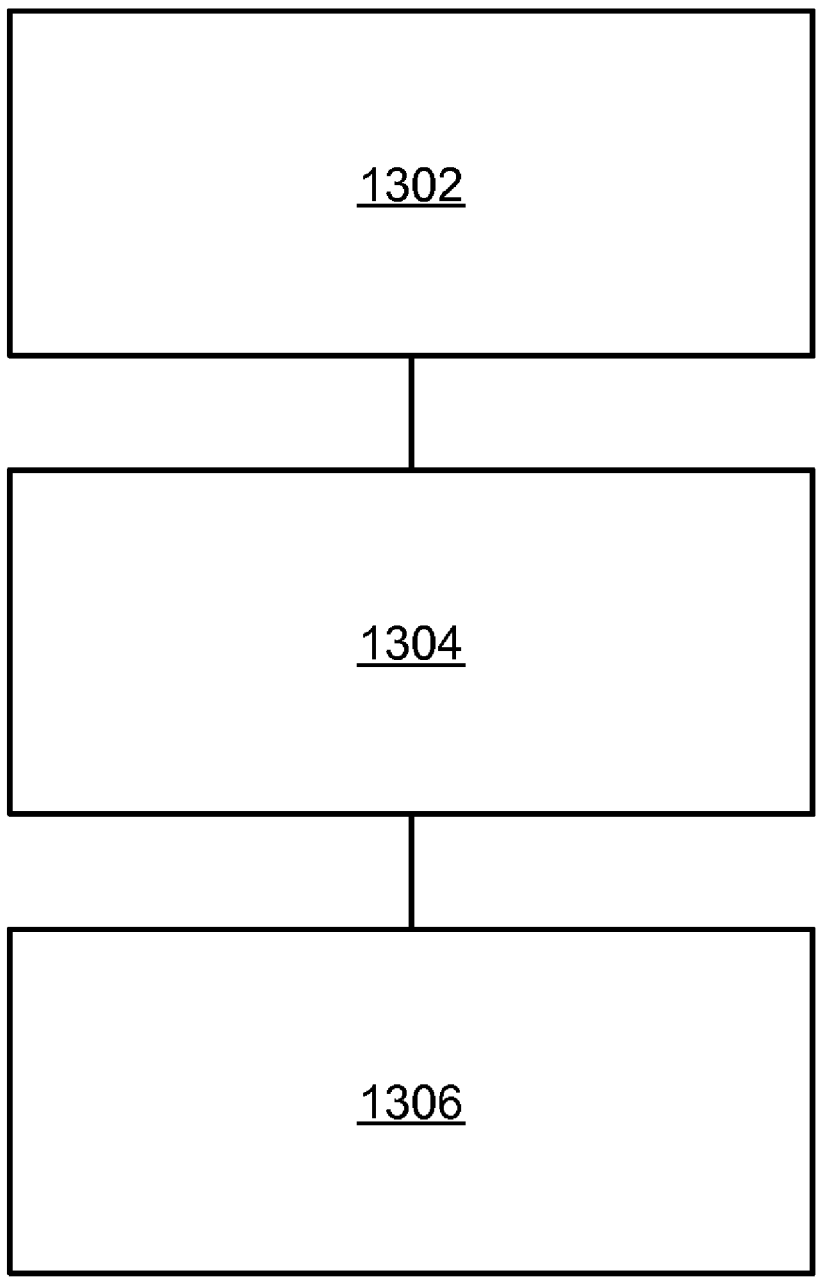
FIG. 13 is a flow chart of an integrated circuit package system for manufacture of the integrated circuit package system in an embodiment of the present invention.

Referring now to FIG. 13, therein is shown a flow chart of an integrated circuit package system 1300 for manufacture of the integrated circuit package system 100 in an embodiment of the present invention. The system 1300 includes forming a paddle, an outer lead, and an inner lead between the paddle and the outer lead in a block 1302; forming a non-vertical paddle edge of the paddle and a non-vertical lead edge of the inner lead facing the non-vertical paddle edge in a block 1304; and encapsulating an integrated circuit die over the paddle in a block 1306.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package system.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of forming an integrated circuit package comprising:
   forming a paddle, an outer lead, and an inner lead between the paddle and the outer lead;
   forming a non-vertical paddle edge of the paddle and a non-vertical lead edge on the inner lead, and the non-vertical lead edge faces the non-vertical paddle edge, and the non-vertical lead edge is further away from the paddle near a non-exposed side of the inner lead than the non-vertical lead edge near an exposed side of the inner lead;
   forming a lead edge substantially vertical from the non-exposed side of the inner lead to the exposed side of the inner lead, and opposite the non-vertical edge of the inner lead; and
   encapsulating an integrated circuit die over the paddle.

2. The method as claimed in claim 1 further comprising forming a middle lead between the inner lead and the outer lead.

3. The method as claimed in claim 1 wherein:
   forming the paddle, the outer lead, and the inner lead includes:
      forming the inner lead integral with the paddle;
   forming the non-vertical paddle edge of the paddle and the non-vertical lead edge of the inner lead also includes:
      forming an inner lead protrusion in the inner lead; and
      removing the inner lead protrusion for forming the paddle having the non-vertical paddle edge and the inner lead having the non-vertical lead edge.

4. The method as claimed in claim 1 further comprising forming a middle lead integral with the paddle between the inner lead and the outer lead.

5. The method as claimed in claim 1 further comprising attaching an external interconnect with the inner lead and the outer lead.

6. A method of forming an integrated circuit package comprising:
   forming a paddle, an outer lead, and an inner lead integral with the paddle;
   forming an inner lead protrusion in the inner lead that is integral with the paddle;
   removing the inner lead protrusion for forming the paddle having a non-vertical paddle edge and the inner lead having a non-vertical lead edge, and the non-vertical lead edge faces the non-vertical paddle edge, and the non-vertical lead edge is further away from the paddle near a non-exposed side of the inner lead than the non-vertical lead edge near an exposed side of the inner lead;
   forming a lead edge substantially vertical from the non-exposed side of the inner lead to the exposed side of the inner lead, and opposite the non-vertical edge of the inner lead; and
   encapsulating an integrated circuit die over the paddle.

7. The method as claimed in claim 6 wherein removing the inner lead protrusion includes grinding the inner lead protrusion for separating the inner lead and the paddle.

8. The method as claimed in claim 6 wherein removing the inner lead protrusion includes lasing the inner lead protrusion for separating the inner lead and the paddle.

9. The method as claimed in claim 6 wherein removing the inner lead protrusion includes etching the inner lead protrusion for separating the inner lead and the paddle.

10. The method as claimed in claim 6 wherein the encapsulating includes encapsulating partially the inner lead and the outer lead.

11. An integrated circuit package system comprising:
   a paddle having a non-vertical paddle edge;
   an outer lead;
   an inner lead having a non-vertical lead edge between the paddle and the outer lead with the non-vertical lead edge facing the non-vertical paddle edge, and the non-vertical lead edge is further away from the paddle near a non-exposed side of the inner lead than the non-vertical lead edge near an exposed side of the inner lead;
   a lead edge substantially vertical from the non-exposed side of the inner lead to the exposed side of the inner lead, and opposite the non-vertical edge of the inner lead;
   an integrated circuit die over the paddle; and
   an encapsulation over the integrated circuit die.

12. The system as claimed in claim 11 further comprising a middle lead between the inner lead and the outer lead.

13. The system as claimed in claim 11 wherein the non-vertical lead edge and the non-vertical paddle edge are characterized in being formed from removal of an inner lead protrusion in the inner lead integral with the paddle to form the non-vertical lead edge facing the non-vertical paddle edge.

14. The system as claimed in claim 11 further comprising a middle lead integral with the paddle between the inner lead and the outer lead.

15. The system as claimed in claim 11 further comprising an external interconnect connected with the inner lead and the outer lead.

* * * * *